US010591844B2

(12) United States Patent
Kato

(10) Patent No.: US 10,591,844 B2
(45) Date of Patent: Mar. 17, 2020

(54) DEVELOPMENT DEVICE AND IMAGE FORMING DEVICE

(71) Applicant: HEWLETT-PACKARD DEVELOPMENT COMPANY, L.P., Spring, TX (US)

(72) Inventor: Yuya Kato, Kanagawa (JP)

(73) Assignee: HEWLETT-PACKARD DEVELOPMENT COMPANY L.P., Spring, TX (US)

( * ) Notice: Subject to any disclaimer, the term of this patent is extended or adjusted under 35 U.S.C. 154(b) by 0 days.

(21) Appl. No.: 16/415,629

(22) Filed: May 17, 2019

(65) Prior Publication Data

US 2019/0339631 A1 Nov. 7, 2019

Related U.S. Application Data

(63) Continuation of application No. PCT/JP2017/020852, filed on Jun. 5, 2017.

(30) Foreign Application Priority Data

Dec. 19, 2016 (JP) ................................ 2016-245629

(51) Int. Cl.

*G01R 1/00* (2006.01)
*G03G 15/08* (2006.01)
*G03G 15/16* (2006.01)
*G03G 15/00* (2006.01)

(52) U.S. Cl.

CPC ..... *G03G 15/0812* (2013.01); *G03G 15/0818* (2013.01); *G03G 15/163* (2013.01); *G03G 15/5008* (2013.01)

(58) Field of Classification Search

CPC ........... G03G 21/1842; G03G 21/1647; G03G 21/1814; G03G 21/1821; G03G 5/0696
USPC ........................................................ 399/111
See application file for complete search history.

(56) References Cited

U.S. PATENT DOCUMENTS

| | | | | |
|---|---|---|---|---|
| 7,043,181 B2 * | 5/2006 | Fujishima | G03G 15/0806 | 399/279 |
| 2003/0170050 A1 * | 9/2003 | Terai | G03G 15/0921 | 399/267 |
| 2009/0022902 A1 * | 1/2009 | Johnson | B05D 1/40 | 427/487 |

(Continued)

FOREIGN PATENT DOCUMENTS

| | | | | |
|---|---|---|---|---|
| JP | 2003208027 | | 7/2003 | |
| JP | 2003208027 A | * | 8/2003 | G03G 15/09 |

(Continued)

*Primary Examiner* — Walter L Lindsay, Jr.
*Assistant Examiner* — Frederick Wenderoth
(74) *Attorney, Agent, or Firm* — Staas & Halsey LLP

(57) ABSTRACT

An image forming apparatus includes a developer carrying body to transfer developer to a photosensitive body. The developer carrying body has an outer circumference and grooves spaced apart along the outer circumference. The grooves occupy 27% or more of the outer circumference. The developing carrying body is rotatable in a rotational direction that imparts the developing carrying body with a direction of movement that is opposite to a direction of movement of the photosensitive body, at a position between the developer carrying body and the photosensitive body.

14 Claims, 10 Drawing Sheets

(56) References Cited

U.S. PATENT DOCUMENTS

| | | | | |
|---|---|---|---|---|
| 2013/0078006 | A1* | 3/2013 | Kawashima | G03G 15/0818 399/279 |
| 2013/0195513 | A1* | 8/2013 | Uehara | G03G 15/0921 399/269 |
| 2015/0104220 | A1* | 4/2015 | Sakamaki | G03G 15/0812 399/276 |

FOREIGN PATENT DOCUMENTS

| | | |
|---|---|---|
| JP | 2013238811 | 11/2013 |
| JP | 2016173518 | 9/2016 |

* cited by examiner

DEVELOPMENT DEVICE AND IMAGE FORMING DEVICE

CROSS-REFERENCE TO RELATED APPLICATIONS

This application is a continuation application of PCT International Patent Application No. PCT/JP2017/020852, filed Jun. 5, 2017, which claims priority from Japanese Patent Application No. 2016-245629, filed on Dec. 19, 2016, the disclosures of each of the foregoing is incorporated herein by reference.

BACKGROUND

Some image forming apparatus include an electrophotographic system wherein an electrostatic latent image is formed on a uniformly charged outer circumferential surface of a photosensitive drum and the electrostatic latent image is formed by toner to obtain an image. A developer carrying body supplies the photosensitive drum with a developer containing toner and carrier.

Such image forming apparatus may operate with a counter developing scheme, by which the direction of movement of the developer carrying body and the direction of movement of the photosensitive drum are opposite to each other between the developer carrying body and the photosensitive drum.

DETAILED DESCRIPTION

Figure 1:
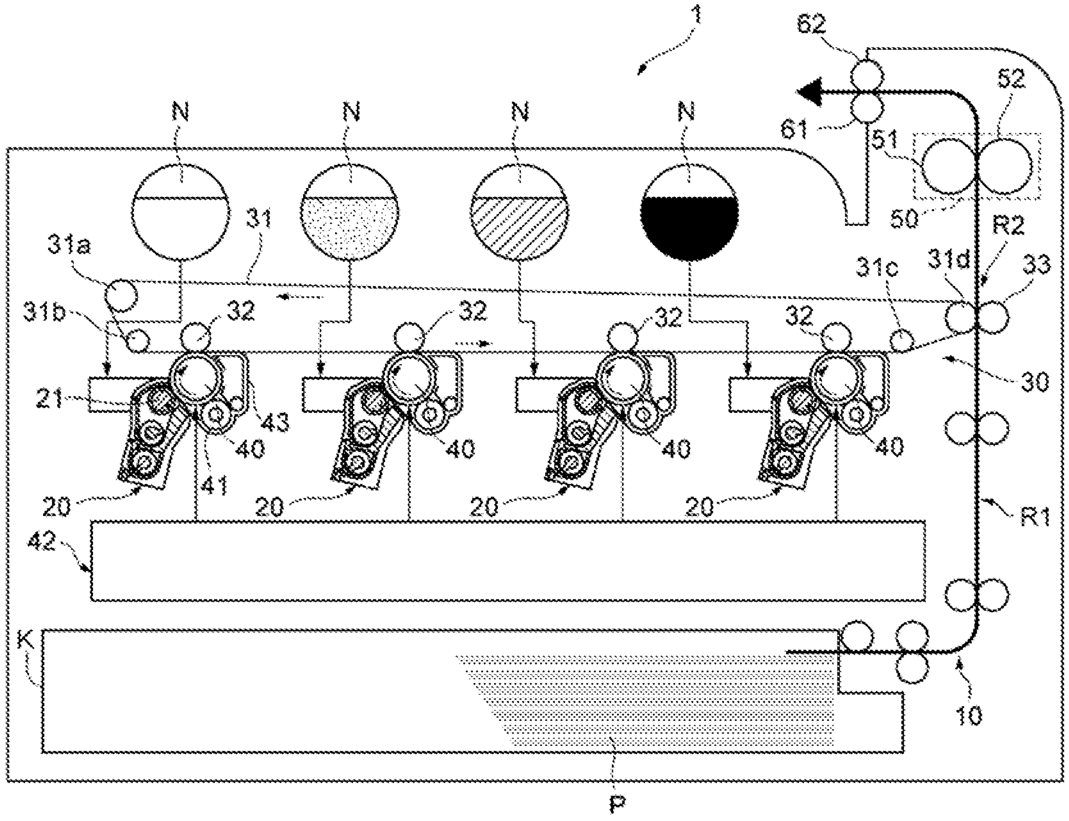
FIG. 1 is a schematic view of an example imaging apparatus including an example developing device.

In a counter developing scheme, the direction of movement of a developer carrying body and the direction of movement of a photosensitive body are opposite to each other between the developer carrying body and the photosensitive body. For example, when the developer carrying body and the photosensitive body rotate in a same rotational direction, e.g., both clock-wise or both counter-clock-wise, then at a position between the developer carrying body and the photosensitive body, the developer carrying body moves in a direction opposite to the movement of the photosensitive body. As such, when the distance between the developer carrying body and the photosensitive body is narrow, and the amount of transfer of a developer by the developer carrying body is large, clogging or jamming of the developer may occur, which may in turn cause substantial constraints to be imposed on the distance between the developer carrying body and the photosensitive body, and on the amount of transfer of the developer by the developer carrying body.

An example developing device comprises a developer container to contain a developer comprising toner and carrier, a stir-and-transfer member to transfer the developer contained in the developer container while stirring, and a developer carrying body disposed spaced apart from a photosensitive body to have an electrostatic latent image formed thereon, the developer carrying body to supply the photosensitive body with the developer. The developer carrying body is rotatable such that the direction of movement of the photosensitive body and the direction of movement of the developer carrying body are opposite to each other, at a position between the photosensitive body and the developer carrying body.

The developer carrying body in the example developing device has an outer circumferential surface having a plurality of grooves arrayed along the circumferential direction of the developer carrying body. The plurality of grooves occupies 27% or more of the entire outer circumference that is assumed when the grooves are not provided. A distance between circumferentially adjacent grooves may be 650 μm or less.

The example developer carrying body of the developing device has a plurality of grooves arrayed along the circumferential direction of the developer carrying body. Of the entire outer circumference of the developer carrying body that is assumed when the grooves are not provided, a percentage occupied by the plurality of grooves is 27% or more, and a distance between circumferentially adjacent grooves is 650 μm or less. The provision of such grooves may enable to adjust the amount of the developer entering into the grooves and to more adequately adjust the amount of transfer of the developer, thereby improving the degree of freedom for positioning the components of the developing device, regarding the distance between the developer carrying body and the photosensitive body, as well as the amount of transfer of the developer can be improved thereby.

An example developing device comprises a developer container to contain a developer comprising toner and carrier, a stir-and-transfer member to transfer the developer contained in the developer container while stirring, a developer carrying body disposed spaced from a photosensitive body to have formed thereon an electrostatic latent image, the developer carrying body to supply the photosensitive body with the developer. The developer carrying body is rotated such that the direction of movement of the photosensitive body and the direction of movement of the developer carrying body are opposite to each other, at a position between the photosensitive body and the developer carrying body, a plurality of grooves arrayed along the circumferential direction of the developer carrying body are provided in an outer circumferential surface of the developer carrying body. The plurality of grooves occupies 27% or more of the entire outer circumference that is assumed when the grooves are not provided. In a cross section of the developer carrying body that is orthogonal to the direction of an axis of rotation of the developer carrying body, a straight line connecting a circumferential midpoint of one groove and the center of the cross section forms an angle of 4° or less with a straight line connecting a circumferential midpoint of another groove adjacent to the one groove and the center of the cross section.

The developer carrying body of the example developing device is provided with a plurality of grooves arrayed along the circumferential direction of the developer carrying body. Of the entire outer circumference of the developer carrying body that is assumed when the grooves are not provided, a percentage occupied by the plurality of grooves is 27% or more, and, in a cross section of the developer carrying body that is orthogonal to the direction of the axis of rotation, a straight line connecting a circumferential midpoint of one groove and the center of the cross section forms an angle of 4° or less with a straight line connecting a circumferential midpoint of another groove adjacent to the one groove and the center of the cross section. The provision of such grooves enables to adjust the amount of the developer entering into the grooves and to more adequately adjust the amount of transfer of the developer. The degree of freedom in the positioning of the components regarding the distance between the developer carrying body and the photosensitive body, as well as the amount of transfer of the developer can be improved thereby.

In some examples, the depth of the grooves may be no less than a volume average particle diameter of the carrier and no greater than 90 μm. In this case, as the carrier tends to be caught by the grooves, the amount of transfer of the developer by the developer carrying body can be increased, thereby suppressing a decrease in the amount of transfer of the developer.

In some examples, the distance between the developer carrying body and the photosensitive body may be 150 μm or more and 350 μm or less. When the distance between the developer carrying body and the photosensitive body is set in this manner, the degree of freedom in the positioning of the components, regarding the amount of transfer of the developer by the developer carrying body can be improved.

In some examples, the amount of transfer of the developer by the developer carrying body may be 150 $g/m^2$ or more and 300 $g/m^2$ or less. When the amount of transfer of the developer is set in this manner, the degree of freedom regarding the distance between the developer carrying body and the photosensitive body can be improved.

In some examples, in a cross section of the developer carrying body orthogonal to the direction of axis of rotation of the developer carrying body, the grooves may be formed to have a shape that flares radially outwardly from an end most proximate to the center of the cross section. In this case, as the carrier tends to be caught by the grooves, the amount of transfer of the developer by the developer carrying body can be increased, thereby suppressing a decrease in the amount of transfer of the developer.

In some examples, a ten-point average roughness Rz of the surface of the developer carrying body may be 24 μm or more. In this case, the frictional resistance of the surface of the developer carrying body is increased, and the amount of transfer of the developer by the developer carrying body can be increased thereby. Accordingly, decrease in the amount of transfer of the developer can be suppressed, and the thickness of a developer layer formed on the surface of the developer carrying body can be made constant.

In some examples, a volume average particle diameter of the carrier may be 20 μm or more and 40 μm or less, and a saturation magnetization of the carrier may be 60 emu/g or more and 70 emu/g or less. When the volume average particle diameter of the carrier is 40 μm or less, coarseness of image quality can be suppressed and good image quality can be obtained thereby. When the saturation magnetization of the carrier is 60 emu or more, it is possible to suppress weakening of the magnetic adhesion between the developer carrying body and the carrier. Accordingly, the adhesion between the developer carrying body and the carrier can be strengthened and the adhesion of the carrier to the photosensitive body can be suppressed, thereby suppressing an image deficiency. In some examples, when the saturation magnetization of the carrier is 70 emu/g or less, it is possible to suppress the magnetic adhesion between the developer carrying body and the carrier from becoming too strong. Accordingly, it is possible to suppress image deficiency which may be caused when the height of bristles of the developer formed on the developer carrying body becomes low.

In some example image forming apparatus equipped with an example developing device, the degree of freedom regarding the distance between the developer carrying body and the photosensitive body, as well as the amount of transfer of the developer by the developer carrying body can be improved.

In the following description, with reference to the drawings, the same reference numbers are assigned to the same components or to similar components having the same function, and overlapping description is omitted.

With reference to FIG. 1, an example image forming apparatus 1 may form color images using magenta, yellow, cyan and black colors.

The example image forming apparatus 1 includes a recording medium transport unit 10 for transporting paper sheets P, developing devices 20 for developing electrostatic latent images, a transfer unit 30 for secondarily transferring a toner image to a paper sheet P, photosensitive drums (photosensitive bodies) 40 that are electrostatic latent image carriers, the photosensitive drums 40 having outer circumferential surfaces on which images are to be formed, and a fixing unit 50 for fixing the toner image onto the paper sheet P.

The recording medium transport unit 10 contains paper sheets P, i.e., recording media on which images are to be formed, and transports the paper sheets P along a transport path R1. The paper sheets P are stacked and contained in a cassette K. The recording medium transport unit 10 transports a paper sheet P to a secondary transfer region R2 through the transport path R1 in such a timing that a toner image to be transferred to the paper sheet P arrives at the secondary transfer region R2.

Four developing devices 20 are provided for the respective colors. Each of the example developing devices 20 includes a developing roller (developer carrying body) 21 to transfer toner to the photosensitive drum 40. In the developing device 20, toner and carrier may be adjusted at a selected mixing ratio, and mixed and stirred to disperse the toner uniformly so as to prepare a developer imparted with an optimal amount of charge.

The developer may be carried by the developing roller 21. Then, as the developing roller 21 rotates to transfer the developer to a region facing the photosensitive drum 40, toner may be moved out of the developer carried on the developing roller 21 and onto an electrostatic latent image formed on the outer circumferential surface of the photosensitive drum 40 to develop the electrostatic latent image. The carrier may have a volume average particle diameter of 20 μm or more and 40 μm or less. Further, the carrier may have a saturation magnetization of 60 emu/g or more and 70 emu/g or less.

The transfer unit 30 may transfer toner images formed with the developing devices 20 to the secondary transfer region R2 for secondary transfer to the paper sheet P. The transfer unit 30 may include a transfer belt 31, support rollers 31*a*, 31*b*, 31*c* and 31*d* for supporting the transfer belt 31, primary transfer rollers 32 for holding the transfer belt 31 with the photosensitive drums 40, and a secondary transfer roller 33 for holding the transfer belt 31 with the support roller 31*d*.

The transfer belt 31 is an endless belt circularly moveable by the support rollers 31*a*, 31*b*, 31*c* and 31*d*. The primary transfer rollers 32 are disposed to press against the photosensitive drums 40 from the inner side of the transfer belt 31. The secondary transfer roller 33 is disposed to press against the support roller 31*d* from the outer side of the transfer belt 31.

Four photosensitive drums 40 are provided for the respective colors. Each of the photosensitive drums 40 is positioned along the direction of movement of the transfer belt 31. At corresponding locations around the outer circumference of the photosensitive drum 40, the developer device 20, a charge roller 41, an exposure unit 42 and a cleaning unit 43 are arranged.

The charge roller 41 may uniformly charge the outer circumferential surface of the photosensitive drum 40 to a predetermined potential. The exposure unit 42 may expose the outer circumferential surface of the photosensitive drum 40 charged by the charge roller 41 according to an image to be formed on the paper sheet P. The potential of portions on the outer circumferential surface of the photosensitive drum 40 exposed by the exposure unit 42 is thereby changed to form an electrostatic latent image. The four developing devices 20 may develop the electrostatic latent image formed on the photosensitive drums 40 with toners supplied from toner tanks N located opposite the respective developing devices 20, relative to the photosensitive drum 40, and thereby form toner images on the photosensitive drums 40. The toner tanks N are respectively filled with magenta, yellow, cyan and black toners and carriers. The cleaning unit 43 may collect the toner remaining on the outer circumferential surface of the photosensitive drum 40 after the toner image has been primarily transferred onto the transfer belt 31.

The fixing unit 50 may adhere and fix onto the paper sheet P the toner image that has been secondarily transferred from the transfer belt 31 to the paper sheet P. The fixing unit 50 may include a fixing belt 51 for heating the paper sheet P and a pressure roller 52 for pressing the fixing belt 51. The fixing belt 51 is formed in a cylindrical shape, and the fixing belt 51 is internally provided with a heat source such as a halogen lamp. A contact area called a fixing nip is formed between the fixing belt 51 and the pressure roller 52, and the toner image is fused and fixed onto the paper sheet P when the paper sheet P is passed through the fixing nip.

The example image forming apparatus 1 includes discharge rollers 61 and 62 for discharging out of the apparatus the paper sheet P on which the toner image has been fixed by the fixing unit 50.

An example operation of the example image forming apparatus 1 will be described. When an image signal of a recording image is input to the image forming apparatus 1, a controller of the image forming apparatus 1 may control the charge roller 41 to uniformly charge the outer circumferential surface of the photosensitive drum 40 to a predetermined potential, based on the image signal received. An electrostatic latent image may be formed by irradiating laser light onto the outer circumferential surface of the photosensitive drum 40 with the exposure unit 42.

In the developing device 20, the electrostatic latent image may be developed to form a toner image. The formed toner image may be primarily transferred from the photosensitive drum 40 to the transfer belt 31 in a region at which the photosensitive drum 40 faces the transfer belt 31. The toner images formed on the four photosensitive drums 40 may be successively superimposed (e.g., overlaid or layered) to form a composite toner image on the transfer belt 31. Then, the composite toner image may be secondarily transferred onto the paper sheet P transported from the recording medium transport unit 10 in the secondary transfer region R2 at which the support roller 31*d* faces the secondary transfer roller 33.

The paper sheet P, with the secondarily transferred composite toner image, may be transported to the fixing unit 50. The composite toner image may be fused and fixed onto the paper sheet P while the paper sheet P is made to pass through the fixing nip under heat and pressure. The paper sheet P may be discharged to the outside of the image forming apparatus 1 by the discharge rollers 61 and 62.

Figure 2:
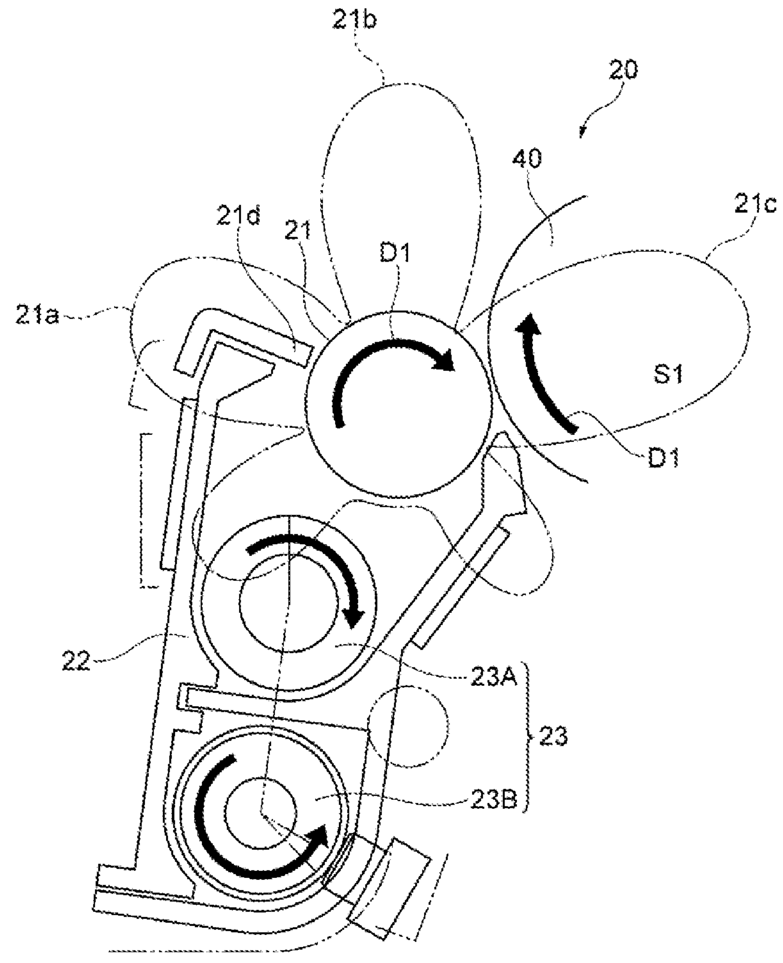
FIG. 2 is a side view of the developing device of the imaging apparatus illustrated in FIG. 1.

With reference to FIG. 2, the example developing device 20 may be a device for performing development using a two-component developing scheme.

The example developing device 20 includes the aforementioned developing roller 21, a developer container 22 containing a two-component developer (developer) including toner and carrier, and a pair of stir-and-transfer members 23 (a first stir-and-transport member 23A and a second stir-and-transport member 23B) to transfer the developer contained in the developer container while stirring.

The example developing roller 21 may supply the toner to an electrostatic latent image formed on an outer circumferential surface of the photosensitive drum 40. The developing roller 21 may carry the developer stirred by the first stir-and-transport member 23A and the second stir-and-transport member 23B. The surface of the developing roller 21 may have been processed by sand blasting, bead blasting, etching or the like. The surface of the developing roller 21 may thereby have a ten-point average roughness Rz of, for example, 24 μm or more and 90 μm or less, or in some examples, 24 μm or more and 40 μm or less.

The surface of the example developing roller 21 includes a layer regulating pole 21*a*, a transferring pole 21*b*, and a developing pole 21*c*. The layer regulating pole 21*a* is located upstream of the transferring pole 21*b* in the direction of rotation D1 of the developing roller 21 (clockwise direction in FIG. 2 and FIG. 3), and the developing pole 21*c* is located downstream of the transferring pole 21*b* in the direction of rotation D1. A layer regulating member 21*d* for regulating a layer of the developer transferred by the developing roller 21 is located at a position facing the layer regulating pole 21*a* of the surface of the developing roller 21. The photosensitive drum 40 is located at a position facing the developing pole 21*c* of the surface of the developing roller 21. In some examples, the layer regulating pole 21*a* is an S-pole, the transferring pole 21*b* is an N-pole and the developing pole 21*c* is an S-pole, and thus the magnetic pole of the layer regulating pole 21*a* (e.g., S-pole) is the same as the magnetic pole of the developing pole 21*c* (e.g., S-pole). In the present example, where the magnetic pole of the layer regulating pole 21*a* and the magnetic pole of the developing pole 21*c* are the same, the degree of freedom for positioning the components of the developing device 20 may be increased, in order to reduce the size of the developing device 20.

Figure 3:
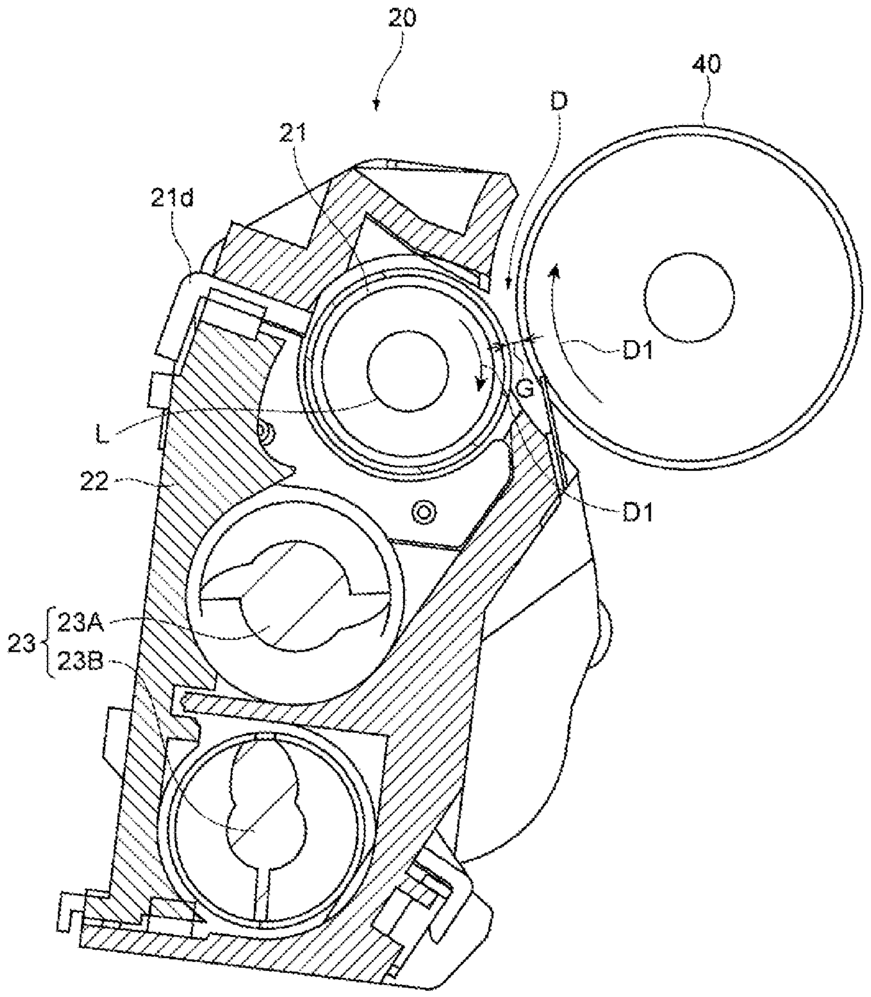
FIG. 3 is an schematic view showing a developing region of the developing device illustrated in FIG. 2.

With reference to FIG. 3, a developing region D is located between the developing roller 21 and the photosensitive drum 40. The developing region D signifies a region in which toner is supplied from the developer carried by the developing roller 21 to the photosensitive drum 40, and at which the developing roller 21 and the photosensitive drum 40 are closest to each other.

The developing roller 21 may rotate in the direction of rotation D1 so that the developer carried thereby is transferred to the photosensitive drum 40. The photosensitive drum 40 may also rotate in the same direction of rotation D1 as the developing roller 21. Accordingly, the developing roller 21 may be rotated such that the direction of movement of the photosensitive drum 40 and the direction of movement of the developing roller 21 are opposite to each other, at a position between the photosensitive drum 40 and the developing roller 21. In the developing region D, the developing roller 21 and the photosensitive drum 40 are disposed to be slightly spaced apart from each other. In some example, the distance between the developing roller 21 and the photosensitive drum 40 corresponds to a gap G, and the value of the gap G may be 150 μm or more and 350 μm or less. Further, the amount of transfer of the developer by the developing roller 21 may be 150 $g/m^2$ or more and 300 $g/m^2$ or less.

Figure 4:
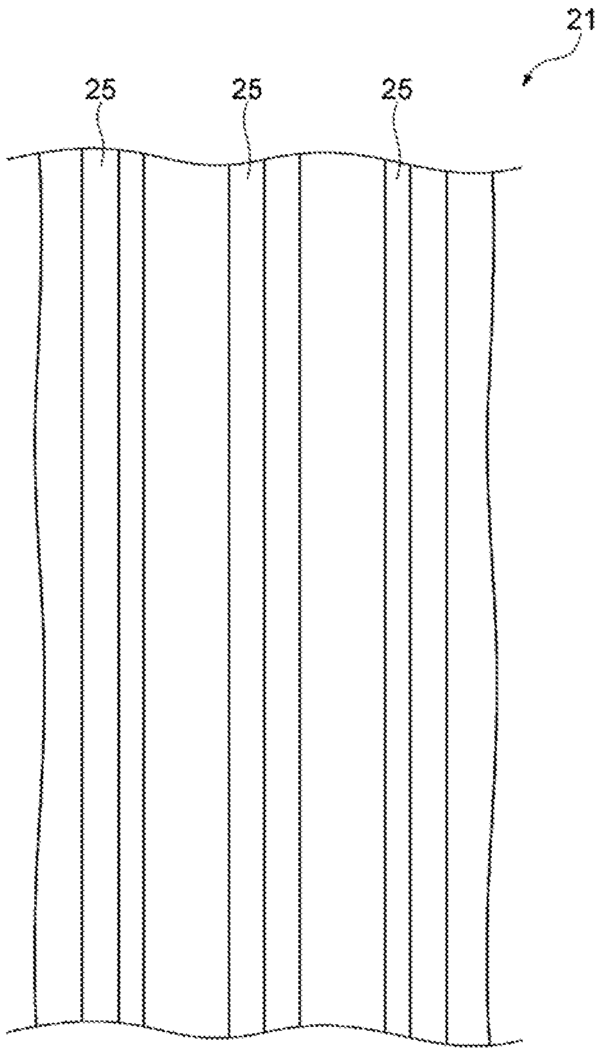
FIG. 4 is an enlarged view of a surface of an example developing roller having an axis of rotation.
Figure 5:
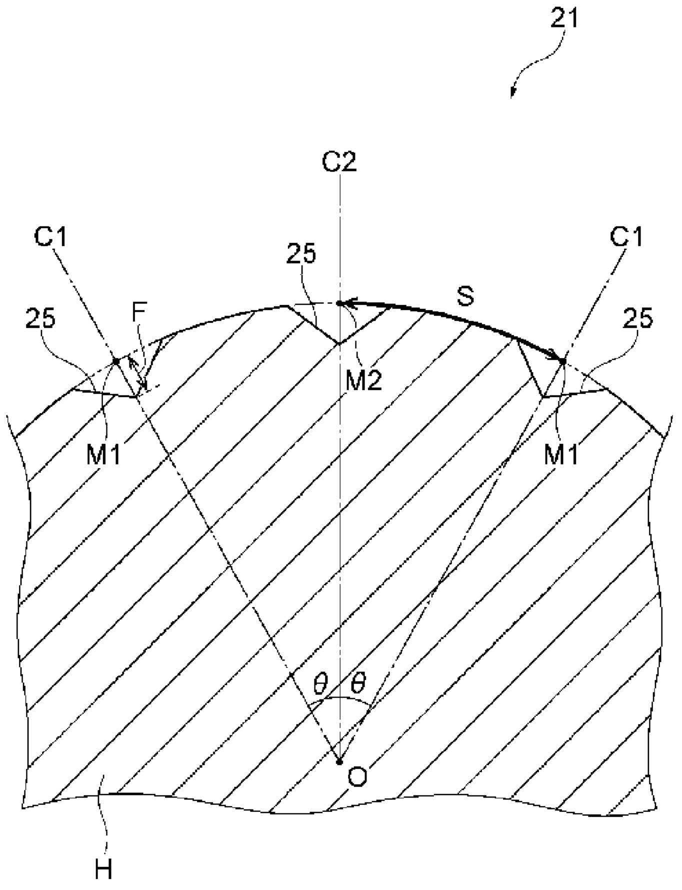
FIG. 5 is a cross-sectional view of the developing roller illustrated in FIG. 4, taken along a plane that is orthogonal to the axis of rotation of the developing roller.

FIG. 4 is an enlarged view of the surface of the developing roller 21. FIG. 5 schematically shows a cross section H of the developing roller 21, taken along a plane that is orthogonal to a direction of axis of rotation (or of rotation axis), of the developing roller 21, e.g., a vertical direction in FIG. 4. The direction of axis of rotation (or the direction of rotation axis) may represent a direction along which the axis of rotation L of the developing roller 21 extends (with reference to FIG. 3), and coincides with a longitudinal direction of the developing roller 21 (e.g. the vertical direction in FIG. 4).

With reference to FIG. 4 and FIG. 5, a plurality of grooves 25 are formed in the surface of the developing roller 21. In the present specification, the term "groove" may refer to a portion recessed relative to the outer circumference of the developing roller 21, and includes all areas from a location where the recess starts to a location where the recess ends. The grooves 25 may include V-shaped grooves, angular grooves, shallow cuttings and the like. The plurality of grooves 25 are arrayed along the circumferential direction of the developing roller 21. Each of the grooves 25 may extend substantially linearly (or longitudinally) along the axis of rotation L. In the cross section H, each groove 25 may be V-shaped.

Accordingly, the developing roller 21 is grooved. A maximum radius of the developing roller (e.g. in a cross-section H of the developing roller) defines an outer circumference of the developer roller 21. The outer circumference is also referred to herein as an "entire outer circumference" of the developer roller 21, and is represented by the dotted portions shown in FIG. 5. The maximum radius may be a radius of the developing roller at a portion that is free of any groove. The plurality of grooves 25 occupies 27% or more of the outer circumference of the developer roller 21, e.g. 27% or more of the entire outer circumference of the developing roller 21 assuming the grooves 25 are not present (e.g., the outer circumference of the developing roller 21 including the dotted portions shown in FIG. 5). A maximum percentage, e.g. an upper limit of the percentage occupied by the plurality of grooves 25, may be 50% in some examples. The maximum percentage may be less than 100% in other examples. A gap S representing a distance along the outer circumference between grooves 25 that are adjacent in the circumferential direction, may measure 650 μm or less in some examples. A lower limit of the gap S may be 200 μm, in some examples. A straight line C1 connecting a circumferential midpoint M1 of one groove 25 and the center O of the cross section H, and a straight line C2 connecting a circumferential midpoint M2 of another groove 25 adjacent to the one groove 25 and the center O of the cross section H, may form an angle θ of 4° or less. A lower limit of the angle θ may be 2°, in some examples.

In some examples, the depth of the grooves 25 is no less than a volume average particle diameter of the carrier and not greater than 90 μm. In some examples, a lower limit of the depth of the grooves 25 may be 30 μm. The depth of the grooves 25 may refer to a radial distance F from the circumferential midpoint M1 or M2 of the grooves 25 to an end (or bottom end) that is closest to the center O of the cross section H. For example, the radial distance F may represent a depth of the groove 25. In some examples, the grooves 25 are V-shaped in the cross section H, forming an angle at the end that is closest to the center O. For example, an angle of the grooves 25 at the end that is closest to the center O of the cross section H may measure 104°.

Figure 6A:
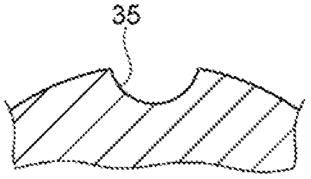
FIG. 6A is a cross-sectional view of a portion of an example developing roller having a groove.
Figure 6B:
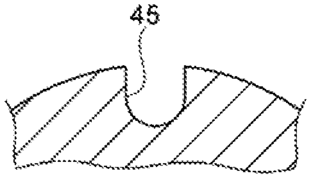
FIG. 6B is a cross-sectional view of a portion of another example developing roller having a groove.
Figure 6C:
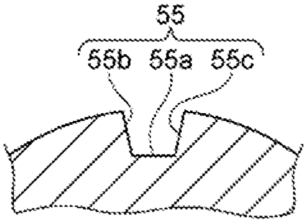
FIG. 6C is a cross-sectional view of a portion of another example developing roller having a groove.

While the grooves 25 having a V-shaped cross-sectional shape have been described in the foregoing, the cross-sectional shape of the grooves may be modified in other examples. FIG. 6A to FIG. 6C show grooves 35, 45 and 55, respectively, according to modified examples. With reference to FIG. 6A, the groove 35 may have a cross-sectional shape corresponding to a semi-circularly recessed curved shape. With reference to FIG. 6B, the groove 45 may have a cross-sectional shape corresponding to a long semi-circular shape terminating with linear portions extending in parallel at the upper ends. With reference to FIG. 6C, the groove 55 may have a cross-sectional shape corresponding substantially to an upwardly opening rectangular shape. For example, the groove 55 has a planar bottom surface 55*a*, a planar side surface 55*b* extending obliquely upwardly from one widthwise end of the bottom surface 55*a*, and a planar side surface 55*c* extending obliquely upwardly from the other widthwise end of the bottom surface 55*a*.

In examples described above, the developing roller 21 of the developing device 20, or the developing roller 21 of the image forming apparatus 1 including the developing device 20, includes the plurality of grooves 25 arrayed along the circumferential direction of the developing roller 21. A percentage occupied by the plurality of grooves 25 may be 27% or more of the entire outer circumference of the developing roller 21 that is assumed when the grooves 25 are not provided, and the gap S between the grooves 25 that are adjacent in the circumferential direction may be 650 μm or less. In the cross section H of the developing roller 21 that is orthogonal to the direction of axis of rotation, an angle θ formed by a straight line C1 connecting a circumferential midpoint M1 of one groove 25 and the center O of the cross section H and a straight line C2 connecting a circumferential midpoint M2 of another groove 25 adjacent to the one groove 25 and the center O of the cross section H may measure 4° or less. The provision of such grooves 25 may enable to adjust the amount of the developer entering into the grooves 25 and to adequately adjust the amount of transfer of the developer. Accordingly, the degree of freedom regarding the gap G between the developing roller 21 and the photosensitive drum 40, as well as the amount of transfer of the developer may be improved.

Figure 7A:
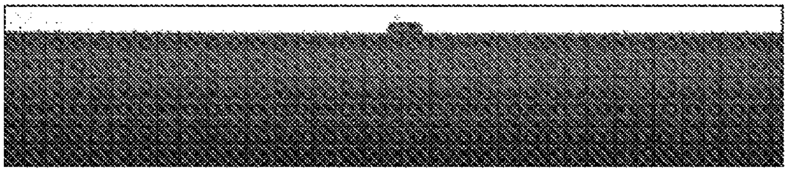
FIG. 7A is a view showing a developer layer of an example developing roller.
Figure 7B:
FIG. 7B is a view showing a developer layer of a comparative example.

FIG. 7A illustrates a developer layer on the example developing roller 21 having the grooves 25 according to an example, and FIG. 7B illustrates a developer layer on a developing roller according to a comparative example having grooves arranged differently than in the example illustrated in FIG. 7A. In the developing device of the comparative example illustrated in FIG. 7B, the developer layer formed on the developing roller tends to become non-uniform, and a reduction rate in the amount of transfer of the developer was 19.9%. According to the developing device 20 of the example illustrated in FIG. 7A, the developer layer is formed on the developing roller 21 more uniformly, and a reduction rate in the amount of transfer of the developer was 1.1%. The "reduction rate in the amount of transfer" may refer to a rate of a first value corresponding to the amount of the developer per unit area of a portion of the developing roller 21 over which the developer is non-uniformly adhered, to a second value corresponding to the amount of the developer per unit area of a portion of the developing roller 21 over which the developer is uniformly adhered. Examples of the developing device 20 comprising an example developing roller 21, may reduce the reduction rate in the amount of transfer to 10% or less, in order to render the developer layer more uniform.

In an example developing device 20, the parameters of the developing roller 21 include a distance of 297.5 μm between the grooves; an angle of 1.9° between adjacent grooves; an angle of 104° of the grooves; a depth of the grooves of 50 μm; and a percentage of 30.5% occupied by the grooves relative to the entire outer circumference of the developing roller 21. The parameters of the developing roller of the developing device according to the comparative example include a distance of 785.0 μm between the grooves; an angle of 5° between adjacent grooves; an angle of 104° at the bottom ends of the grooves; a depth of the grooves of 100 μm; and a percentage of 23.1% occupied by the grooves relative to the entire outer circumference of the developing roller 21.

Figure 8:
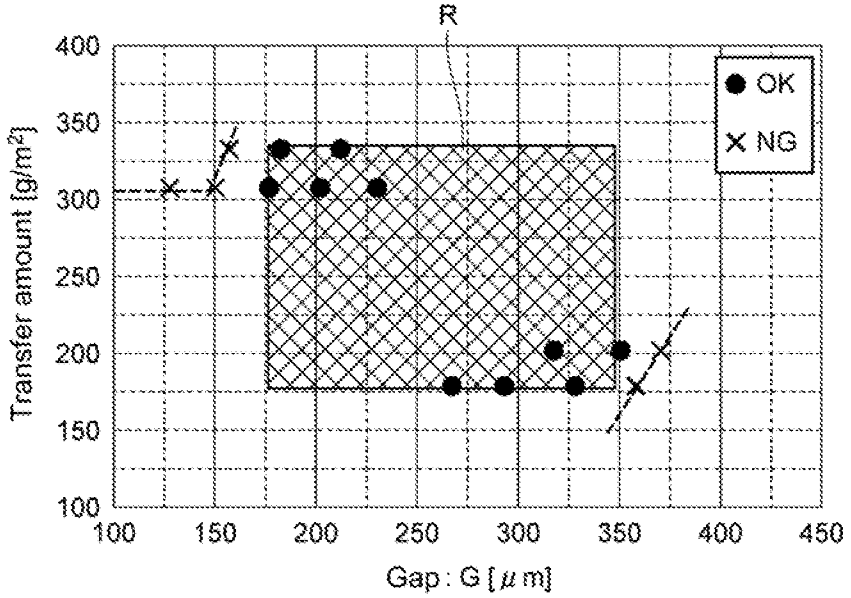
FIG. 8 is a graph showing constraints for a gap between a developing roller and a photosensitive body, in relation to an amount of transfer of a developer according to an example developing device.
Figure 9:
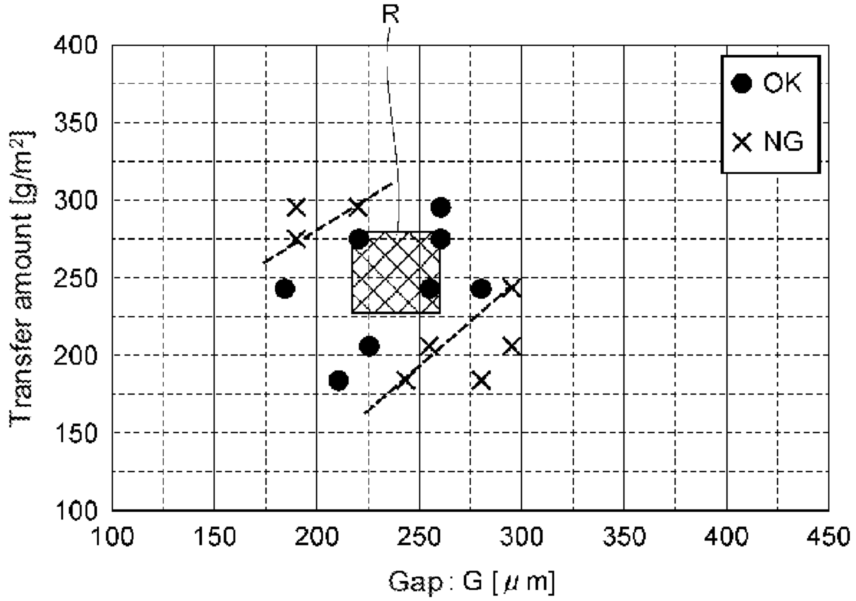
FIG. 9 is a graph showing constraints for a gap between a developing roller and a photosensitive body, in relation to an amount of transfer of a developer according to a developing device of a comparative example.

FIG. 8 is a graph showing constraints on the gap G between the developing roller 21 and the photosensitive drum 40 in the example developing device 20, and the amount of transfer of the developer according to the example developing device 20. FIG. 9 is a graph showing constraints on the distance between the developing roller and the photosensitive drum, and the amount of transfer of the developer according to the developing device of the comparative example. In the graphs of FIG. 8 and FIG. 9, a region R represents a region in which the gap G and the amount of transfer of the developer can be set. The range of the region R represents a range of combinations of the gap G and the amount of transfer of the developer for which there is substantially no occurrence of any image deficiency due to jamming or due to edge effect (a phenomenon where developed toner on the photosensitive body is stripped). The region R in FIG. 8 is significantly larger than the region R in FIG. 9. Accordingly, relative to the developing device according to the comparative example, the degree of freedom regarding the gap G between the developing roller 21 and the photosensitive drum 40, as well as the amount of transfer of the developer, is improved in the example developing device 20.

Figure 10:
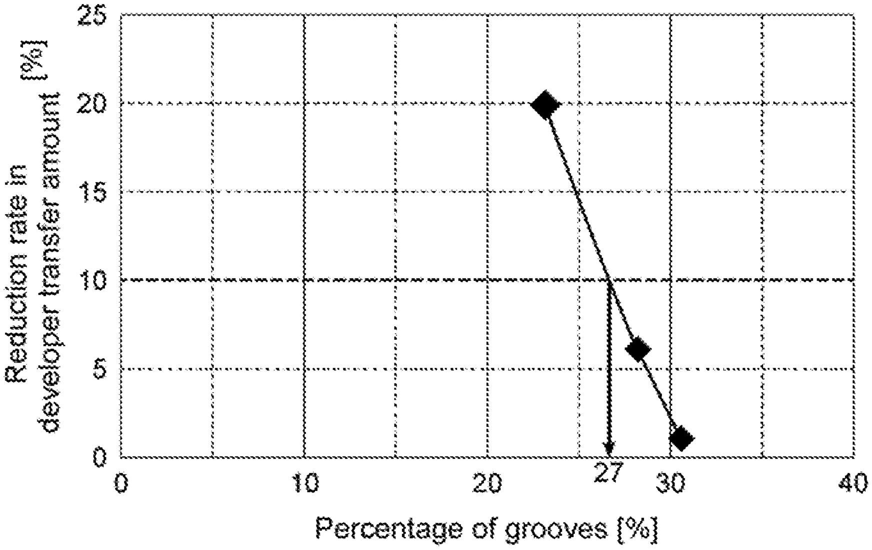
FIG. 10 is a graph showing a percentage of grooves in relation to a reduction rate in the amount of transfer of a developer.

Further, FIG. 10 is a graph showing a relationship between a percentage of the grooves 25 and a reduction rate in the amount of transfer of the developer. For example, the graph may show a percentage of an outer circumference occupied by the grooves 25 in relation to a reduction rate in the amount of transfer of the developer. The graph of FIG. 10 indicates that the reduction rate in the amount of transfer tends to be higher as the percentage of the grooves 25 is lower and the reduction rate in the amount of transfer tends to be lower as the percentage of the grooves 25 is higher. In a region of the graph where the percentage of the grooves 25 is 27% or more, the reduction rate in the amount of transfer is reduced to 10% or less. Accordingly, the uniformization of the developer layer formed on the developing roller 21 may be improved when the percentage occupied by the grooves 25 is 27% or more of the entire outer circumference of the developing roller 21.

Figure 11:
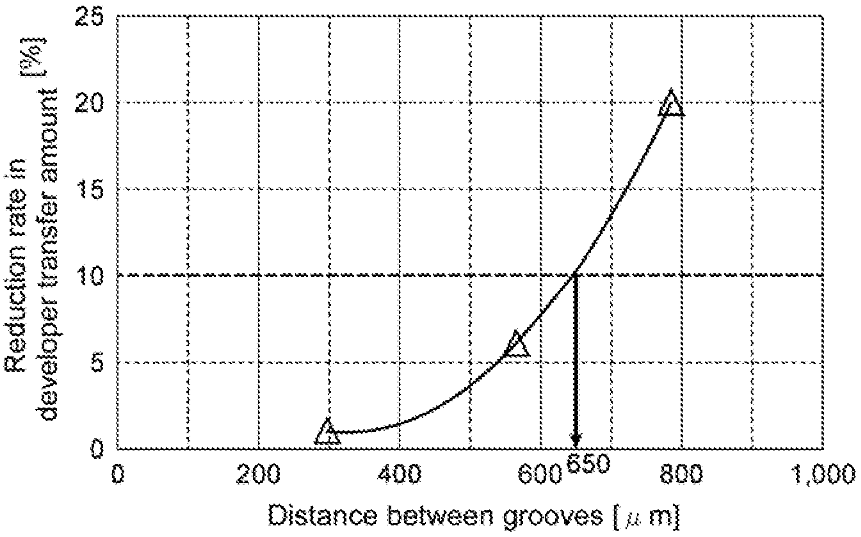
FIG. 11 is a graph showing a distance between grooves in relation to a reduction rate in the amount of transfer of a developer.

Further, FIG. 11 is a graph showing a relationship between a distance between grooves (e.g., the gap S between the adjacent grooves 25 in FIG. 5) and a reduction rate in the amount of transfer of the developer. The graph of FIG. 11 indicates that the reduction rate in the amount of transfer tends to be lower as the distance between the grooves is smaller and the reduction rate in the amount of transfer tends to be higher as the distance between the grooves is larger. In a region of the graph where the distance between the grooves is 650 μm or less, the reduction rate in the amount of transfer is reduced to 10% or less. Accordingly, uniformization of the developer layer formed on the developing roller 21 may be improved when the distance between the grooves 25 which are adjacent to each other in the circumferential direction is 650 μm or less.

Figure 12:
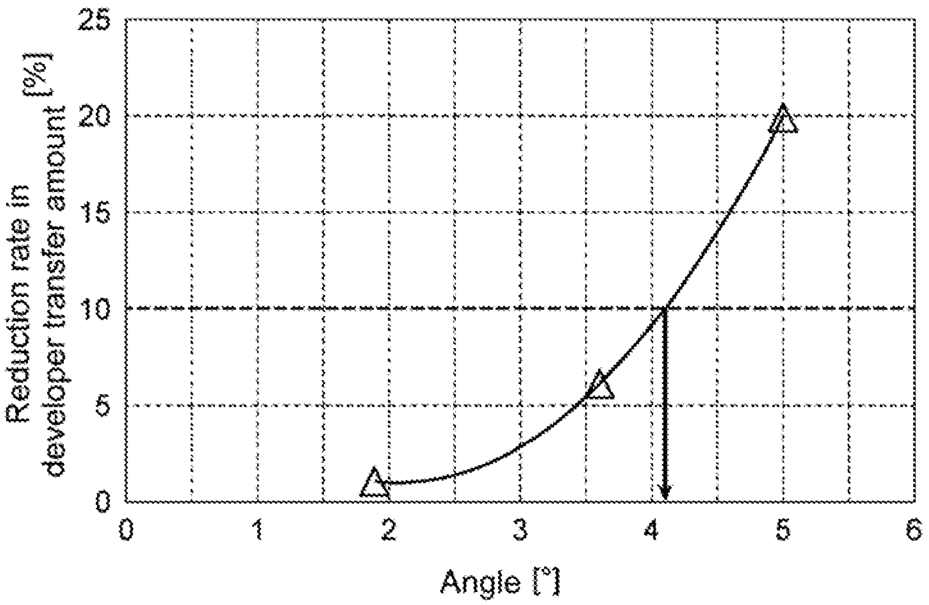
FIG. 12 is a graph showing an angle between adjacent grooves in relation to a reduction rate in the amount of transfer of a developer.

FIG. 12 is a graph showing a relationship between the aforementioned angle θ and a reduction rate in the amount of transfer of the developer. The graph in FIG. 12 indicates that the reduction rate in the amount of transfer tends to be lower as the angle θ is smaller and the reduction rate in the amount of transfer tends to be higher as the angle θ is larger. In a region of the graph where the angle θ is 4° or less, the reduction rate in the amount of transfer is reduced to 10% or less. Accordingly, uniformization of the developer layer formed on the developing roller 21 may be improved when the angle θ is 4° or less.

Figure 13:
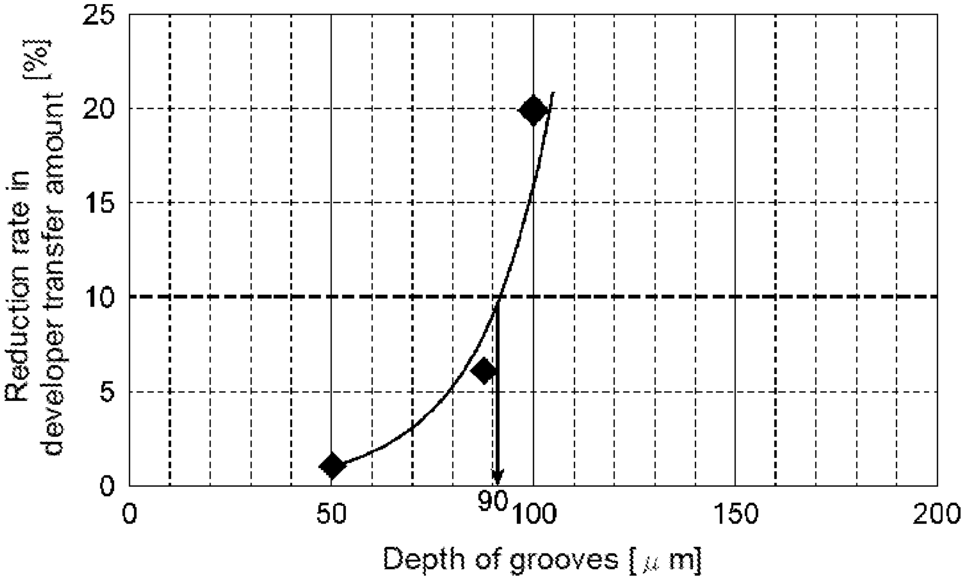
FIG. 13 is a graph showing a depth of grooves in relation to a reduction rate in the amount of transfer of a developer.

In some examples, the depth of the grooves 25 is no less than a volume average particle diameter of the carrier and no greater than 90 μm. Accordingly, the carrier tends to be caught by the grooves 25 and consequently, the amount of transfer of the developer by the developing roller 21 can be increased. Accordingly, decrease in the amount of transfer of the developer can be suppressed. FIG. 13 is a graph showing a relationship between the depth of the grooves 25 (distance F) and a reduction rate in the amount of transfer of the developer. The graph of FIG. 13 indicates that the reduction rate in the amount of transfer tends to be lower as the depth of the grooves 25 is smaller and the reduction rate in the amount of transfer tends to be higher as the depth of the grooves 25 is larger. In a region of the graph where the depth of the grooves 25 is 90 μm or less, the reduction rate in the amount of transfer is reduced to 10% or less. Accordingly, the reduction in the amount of transfer of the developer can be suppressed when the depth of the grooves 25 is 90 μm or less.

In some examples, the gap G between the developing roller 21 and the photosensitive drum 40 is 150 μm or more and 350 μm or less. When the gap G between the developing roller 21 and the photosensitive drum 40 is set in this manner, the degree of freedom regarding the amount of transfer of the developer by the developing roller 21 can be improved (e.g, increased range in the amount of developer transferred by the developing roller 21). In some examples, the amount of transfer of the developer by the developing roller 21 is 150 $g/m^2$ or more and 300 $g/m^2$ or less. When the amount of transfer of the developer is set in this manner, the degree of freedom regarding the gap G between the developing roller 21 and the photosensitive drum 40 can be improved (e.g. increased range of the gap G).

Figure 14:
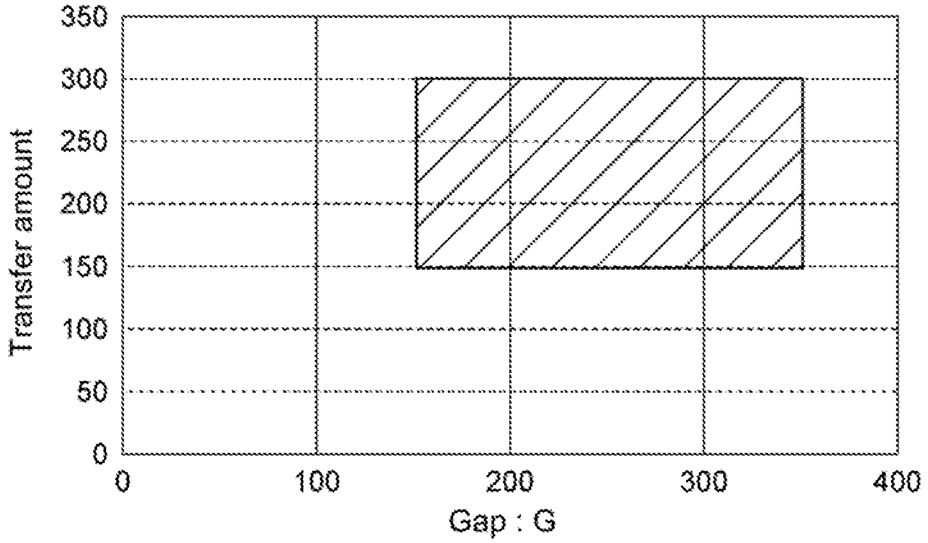
FIG. 14 is a graph showing a targeted area in a relationship between the distance between the developing roller and the photosensitive body, and the amount of transfer of the developer according to an example developing device.

FIG. 14 is a graph showing a suitable (or targeted) area regarding the gap G between the developing roller 21 and the photosensitive drum 40, in relation to the amount of transfer of the developer according to the example developing device 20. In an upper-left region of the graph in FIG. 14, corresponding to a relationship where the gap G is small and the amount of transfer of the developer is large, an image deficiency due to jamming may tend to occur. In a lower-right region of the graph of FIG. 14, where the gap G is large and the amount of transfer of the developer is small, an image deficiency due to shortage in the amount of the developer may tend to occur. As such, the occurrence of image deficiency can be suppressed when the gap G between the developing roller 21 and the photosensitive drum 40 is 150 μm or more and 350 μm or less and the amount of transfer of the developer is 150 $g/m^2$ or more and 300 $g/m^2$ or less.

In some examples, with reference to FIG. 5, in the cross section H of the developing roller 21 orthogonal to the direction of axis of rotation of the developing roller 21, the grooves 25 are formed to have a shape that flares radially outwardly from an end (bottom) most proximate to the center O of the cross section H. With this configuration, the carrier tends to be caught by the grooves 25, and accordingly the amount of transfer of the developer by the developing roller 21 can be increased, so as to suppress a decrease in the amount of transfer of the developer.

In some examples, the ten-point average roughness Rz of the surface of the developing roller 21 is 24 μm or more, in order to increase the frictional resistance of the surface of the developing roller 21, and thereby increase the amount of transfer of the developer by the developing roller 21. Accordingly, a decrease in the amount of transfer of the developer can be suppressed, and the thickness of the developer layer formed on the surface of the developing roller 21 can be made more constant (or more uniform).

Figure 15:
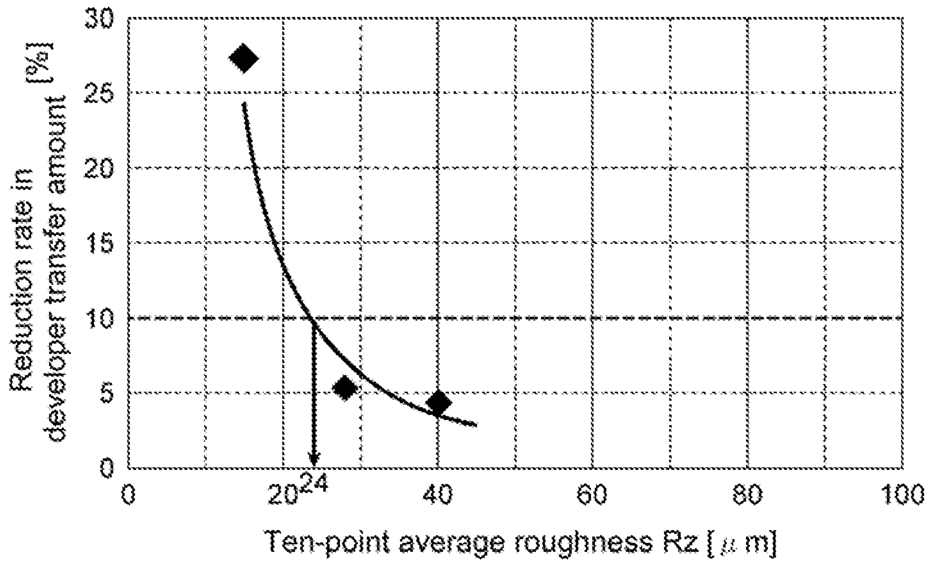
FIG. 15 is a graph showing a relationship between a ten-point average roughness Rz of the surface of an example developing roller, and a reduction rate in the amount of transfer of a developer.

FIG. 15 is a graph showing a relationship between the ten-point average roughness Rz of the surface of the developing roller 21 and a reduction rate in the amount of transfer of the developer. The graph of FIG. 15 indicates that the reduction rate in the amount of transfer tends to be higher as the ten-point average roughness R1 is smaller and the reduction rate in the amount of transfer tends to be lower as the ten-point average roughness Rz is larger. In a region of the graph where the ten-point average roughness Rz is 24 μm or more, the reduction rate in the amount of transfer is reduced to 10% or less. Accordingly, the reduction in the amount of transfer of the developer can be suppressed when the ten-point average roughness Rz is 24 μm or less.

It is to be understood that not all aspects, advantages and features described herein may necessarily be achieved by, or included in, any one particular example. Indeed, having described and illustrated various examples herein, it should be apparent that other examples may be modified in arrangement and detail.

One or more of the examples described above and/or features thereof may be expressed by the following clauses.

Clause 1. A developing device including:

a developer container to contain a developer comprising toner and carrier;

a stir-and-transfer member to transfer the developer contained in the developer container while stirring; and a developer carrying body spaced apart from a photosensitive body to form an electrostatic latent image, the developer carrying body to supply the photosensitive body with the developer, wherein the developer carrying body is rotatable in a rotational direction that causes a direction of movement of the photosensitive body to be opposite to a direction of movement of the developer carrying body between the photosensitive body and the developer carrying body, wherein the developer carrying body has an outer circumferential surface that comprises grooves arrayed along a circumferential direction of the developer carrying body, wherein the grooves occupy approximately 27% or more of an entire outer circumference of the developer carrying body assuming the grooves are not present, and wherein a distance between the grooves adjacent to each other in the circumferential direction is 650 μm or less.

Clause 2. A developing device including:

a developer container to contain a developer comprising toner and carrier;

a stir-and-transfer member to transfer the developer contained in the developer container while stirring; and a developer carrying body spaced apart from a photosensitive body to form an electrostatic latent image, the developer carrying body to supply the photosensitive body with the developer, wherein the developer carrying body is rotatable about a rotational axis, to impart the developer carrying body with a direction of movement that is opposite to a direction of movement of the photosensitive body, at a position between the photosensitive body and the developer carrying body, wherein the developer carrying body has an outer circumferential surface that comprises grooves arrayed along a circumferential direction of the developer carrying body, wherein the grooves occupy 27% or more of an entire outer circumference of the developer carrying body assuming the grooves are not present, and wherein the grooves comprises a first groove and a second groove adjacent the first groove, wherein a cross section of the developer carrying body that is orthogonal to the rotational axis of the developer carrying body, comprises a first line connecting a circumferential midpoint of the first groove with a center of the cross section and a second line connecting a circumferential midpoint of the second groove with the center of the cross section, and wherein the first line and the second line form an angle of 4° or less.

Clause 3. The developing device according to clause 1 or 2, wherein the depth of the grooves is no less than a volume average particle diameter of the carrier and no greater than approximately 90 μm.

Clause 4. The developing device according to any one of clauses 1 to 3, wherein a distance between the developer carrying body and the photosensitive body is between approximately 150 μm and 350 μm.

Clause 5. The developing device according to any one of clauses 1 to 4, wherein the amount of transfer of the developer by the developer carrying body is between approximately 150 $g/m^2$ and 300 $g/m^2$.

Clause 6. The developing device according to any one of clauses 1 to 5, wherein, in a cross section of the developer carrying body orthogonal to the direction of axis of rotation of the developer carrying body, the grooves are formed to have a shape that flares radially outwardly from an end most proximate to the center of the cross section.

Clause 7. The developing device according to any one of clauses 1 to 6, wherein a ten-point average roughness Rz of the surface of the developer carrying body is approximately 24 μm or more.

Clause 8. The developing device according to any one of clauses 1 to 7, wherein a volume average particle diameter of the carrier is between approximately 20 μm and 40 μm, and a saturation magnetization of the carrier is between approximately 60 emu/g and 70 emu/g.

Clause 9. An imaging apparatus including:

a developing carrying body to transfer developer to a photosensitive body, the developing carrying body having an outer circumference and grooves spaced apart along the outer circumference of the developing carrying body, wherein the outer circumference is associated with a maximum radius of a cross section of the developing carrying body including the grooves, wherein the grooves are recessed relative to the outer circumference, and wherein the grooves occupy 27% or more of the outer circumference in the cross section, the developing carrying body to rotate in a rotational direction that imparts the developing carrying body with a direction of movement that is opposite to a direction of movement of the photosensitive body, at a position between the developer carrying body and the photosensitive body.

Clause 10. The imaging apparatus according to clause 9, wherein the developing carrying body has a rotation axis and wherein the grooves extend parallel to the rotation axis of the developing carrying body.

Clause 11. The imaging apparatus according to clause 10, wherein the cross section of the developer carrying body is oriented perpendicularly to the rotation axis of the developer carrying body, and wherein the grooves have a profile in the cross section that gradually widens toward the outer circumference.

Clause 12. The imaging apparatus according to any one of clauses 9 to 11, wherein each of the grooves is associated with a circumferential midpoint at a center of the groove along the outer circumference of the developing carrying body (e.g., in the cross section), and wherein a distance along the outer circumference between two circumferential midpoints associated with two adjacent grooves is approximately 650 μm or less.

Clause 13. The imaging apparatus according to any one of clauses 9 to 12, wherein (e.g., in the cross section) each of the grooves is associated with a center line that extends radially from the rotation axis to a circumferential midpoint at a center of the groove along the outer circumference, and wherein adjacent center lines associated with two adjacent grooves form an angle of 4° or less.

Clause 14. The imaging apparatus according to any one of clauses 9 to 13, wherein the grooves have a depth of no less than a volume average particle diameter of carrier contained in the developer and of no more than approximately 90 μm.

Clause 15. The developing device according to any one of clauses 9 to 14, wherein the developer carrying body is distanced from the photosensitive body by approximately 150 μm to 350 μm, the developer carrying body to carry approximately 150 $g/m^2$ to 300 $g/m^2$ of the developer.

The invention claimed is:

1. A developing device comprising:

a developer container to contain a developer comprising toner and carrier;

a stir-and-transfer member to transfer the developer contained in the developer container while stirring; and a developer carrying body spaced apart from a photosensitive body that is to form an electrostatic latent image, the developer carrying body to supply the photosensitive body with the developer, wherein the developer carrying body is rotatable in a rotational direction that causes a direction of movement of the photosensitive body to be opposite to a direction of movement of the developer carrying body at a position between the photosensitive body and the developer carrying body, wherein the developer carrying body has an outer circumferential surface that comprises grooves arrayed along a circumferential direction of the developer carrying body, wherein the grooves occupy approximately 27% or more of an entire outer circumference of the developer carrying body assuming the grooves are not present, and wherein a distance between two adjacent grooves, among the grooves, in the circumferential direction is 650 μm or less.

2. A developing device comprising:

a developer container to contain a developer comprising toner and carrier;

a stir-and-transfer member to transfer the developer contained in the developer container while stirring; and a developer carrying body spaced apart from a photosensitive body to form an electrostatic latent image, the developer carrying body to supply the photosensitive body with the developer, wherein the developer carrying body is rotatable about a rotational axis, to impart the developer carrying body with a direction of movement that is opposite to a direction of movement of the photosensitive body, at a position between the photosensitive body and the developer carrying body, wherein the developer carrying body has an outer circumferential surface that comprises grooves arrayed along a circumferential direction of the developer carrying body, wherein the grooves occupy 27% or more of an entire outer circumference of the developer carrying body assuming the grooves are not present, and wherein the grooves comprise a first groove and a second groove adjacent the first groove, wherein when a first line is provided to connect a circumferential midpoint of the first groove with a center of a cross section of the developer carrying body that is orthogonal to the rotational axis and when a second line is provided to connect a circumferential midpoint of the second groove with the center of the cross section, the first line and the second line form an angle of 4° or less.

3. An imaging apparatus comprising:

a developing carrying body to transfer developer to a photosensitive body, the developing carrying body having an outer circumference and grooves spaced apart along the outer circumference of the developing carrying body, wherein the outer circumference is associated with a maximum radius of a cross section of the developing carrying body including the grooves, wherein the grooves are recessed relative to the outer circumference, and wherein the grooves occupy 27% or more of the outer circumference, the developing carrying body to rotate in a rotational direction that imparts the developing carrying body with a direction of movement that is opposite to a direction of movement of the photosensitive body, at a position between the developer carrying body and the photosensitive body, the grooves are spaced apart where each of the grooves is associated with a circumferential midpoint at a center of the groove along the outer circumference of the developing carrying body, and wherein a distance along the outer circumference between two circumferential midpoints associated with two adjacent grooves is approximately 650 μm or less.

4. The developing device according to claim 2, wherein a depth of the grooves is no less than a volume average particle diameter of the carrier and no greater than approximately 90 μm.

5. The developing device according to claim 2, wherein a distance between the developer carrying body and the photosensitive body is between approximately 150 μm and 350 μm.

6. The developing device according to claim 2, wherein an amount of transfer of the developer by the developer carrying body is between approximately 150 $g/m^2$ and 300 $g/m^2$.

7. The developing device according to claim 2, wherein, in the cross section of the developer carrying body orthogonal to the axis of rotation of the developer carrying body, the grooves are formed to have a shape that flares radially outwardly from an end most proximate to the center of the cross section.

8. The developing device according to claim 2, wherein a ten-point average roughness Rz of a surface of the developer carrying body is approximately 24 μm or more.

9. The developing device according to claim 2, wherein a volume average particle diameter of the carrier is between approximately 20 μm and 40 μm, and a saturation magnetization of the carrier is between approximately 60 emu/g and 70 emu/g.

10. The imaging apparatus according to claim 3, wherein the developing carrying body has a rotation axis and wherein the grooves extend parallel to the rotation axis in a circumferential direction of the developing carrying body.

11. The imaging apparatus according to claim 10, wherein the cross section of the developer carrying body is oriented perpendicularly to the rotation axis of the developer carrying body, and wherein the grooves have a profile in the cross section that gradually widens toward the outer circumference.

12. The imaging apparatus according to claim 3, wherein each of the grooves is associated with a center line that extends radially from the rotation axis to a circumferential midpoint at a center of the groove along the outer circumference, and wherein adjacent center lines associated with two adjacent grooves form an angle of 4° or less.

13. The imaging apparatus according to claim 3, wherein the grooves have a depth of no less than a volume average particle diameter of carrier contained in the developer and of no more than approximately 90 μm.

14. The imaging apparatus according to claim 3, wherein the developer carrying body is distanced from the photosensitive body by approximately 150 μm to 350 μm, the developer carrying body to carry approximately 150 $g/m^2$ to 300 $g/m^2$ of the developer.

* * * * *